United States Patent [19]

Hegner et al.

[11] Patent Number: 5,157,580
[45] Date of Patent: Oct. 20, 1992

[54] PROTECTIVE PLUG FOR CONNECTOR BANKS OF TELECOMMUNICATION AND DATA SYSTEMS

[75] Inventors: Gunter Hegner; Klaus-Peter Achtnig, both of Berlin, Fed. Rep. of Germany

[73] Assignee: Krone Aktiengesellschaft, Berlin, Fed. Rep. of Germany

[21] Appl. No.: 495,793

[22] Filed: Mar. 16, 1990

[30] Foreign Application Priority Data

Mar. 22, 1989 [DE] Fed. Rep. of Germany ....... 3909783

[51] Int. Cl.$^5$ .......................... H02H 3/22; H04Q 1/14
[52] U.S. Cl. ...................... 361/119; 337/32; 361/124
[58] Field of Search .................. 361/119, 124, 127, 56; 337/31, 32

[56] References Cited

U.S. PATENT DOCUMENTS

| | | | |
|---|---|---|---|
| 4,146,755 | 3/1979 | Canssé | 361/92 |
| 4,642,723 | 2/1987 | Achtnig et al. | 361/124 |
| 4,649,456 | 3/1987 | DeLuca et al. | 361/119 |
| 4,741,711 | 5/1988 | Singa et al. | 439/620 |
| 4,856,060 | 8/1989 | Meyerhoefer et al. | 379/412 |
| 4,866,560 | 9/1989 | Allina | 361/104 |

Primary Examiner—Steven L. Stephan
Assistant Examiner—Ben Davidson
Attorney, Agent, or Firm—McGlew & Tuttle

[57] ABSTRACT

The invention relates to a protective plug (1) for connector banks (20) of telecommunication and data systems, comprising a housing (2) for receiving protective elements (7, 8, 9) connected to establish an electrical connection to an earth rail (44) and with a disconnector contact (43) to a bifurcated contact (41) or to circuit tracks (10) provided on a plug tongue, resp. The disconnector contact (43) is provided with terminal contacts (53) for incoming and outgoing cable conductors. In order to provide a protective plug (1) which protects against overvoltages and serves as well as a fuse against overcurrents and for which the outside dimensions allow a close-fit construction of several protective plugs (1), the plug tongue (5) is a printed-circuit board (4, 4a) extending into the housing (2). Two housing compartments (21, 22) are formed inside the housing (2). Inside the housing compartments (21,22) on either side of the printed-circuit board (4, 4a), protective elements (7, 8, 9) are disposed, which are connected to one another over the circuit tracks (10) and over through-plated terminal positions (A to F).

11 Claims, 4 Drawing Sheets

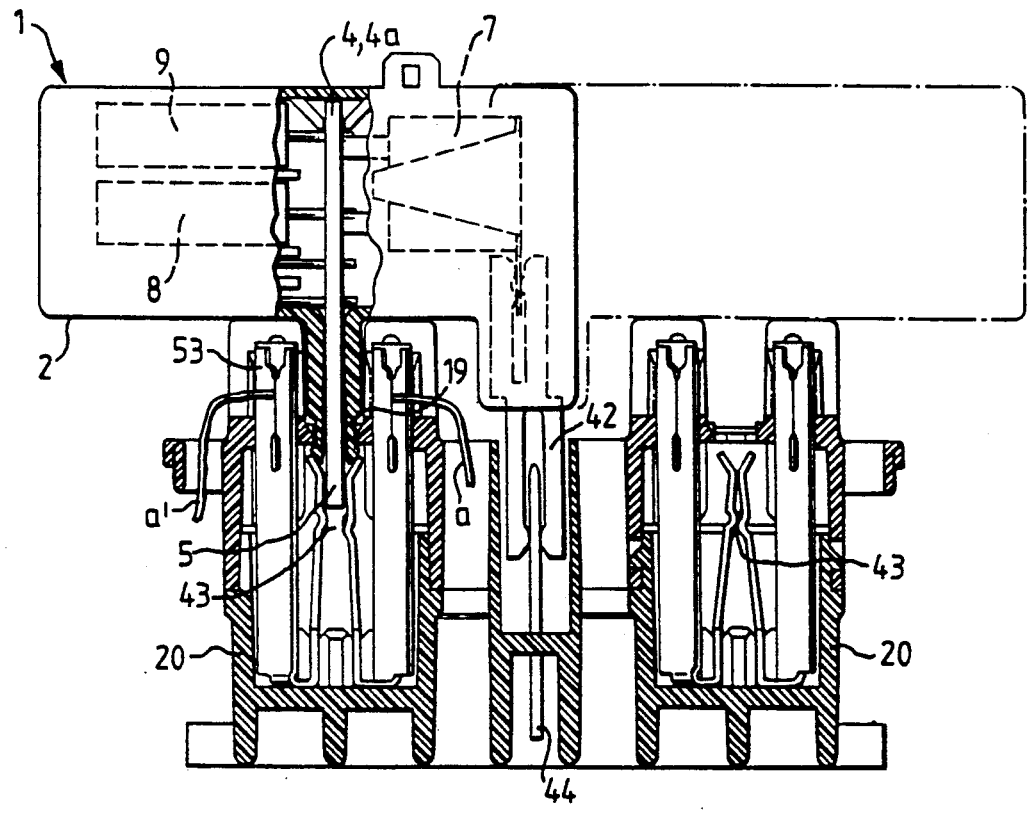
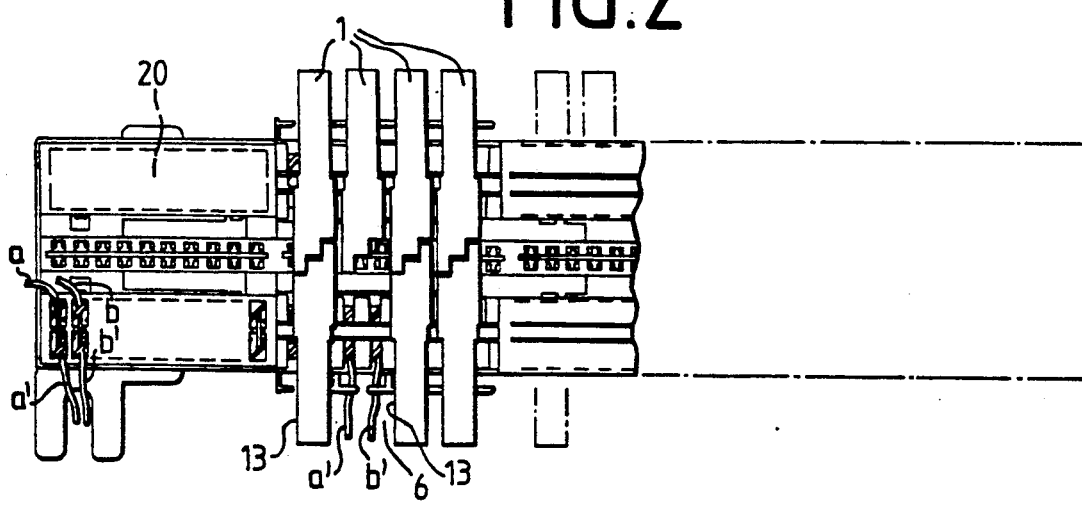

FIG.6  FIG.7
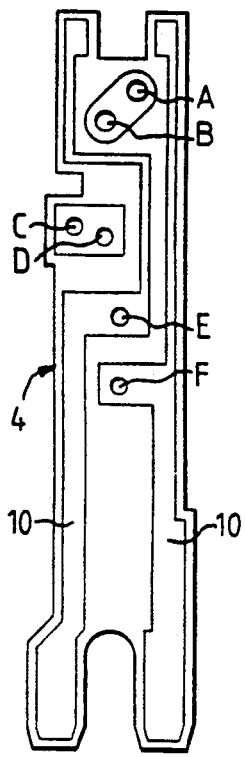
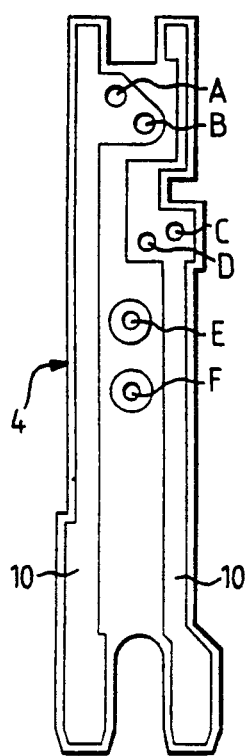
FIG.8  FIG.9
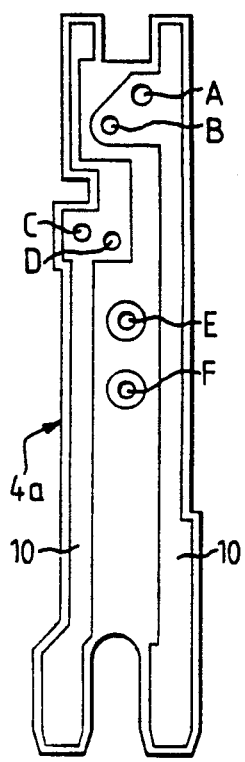
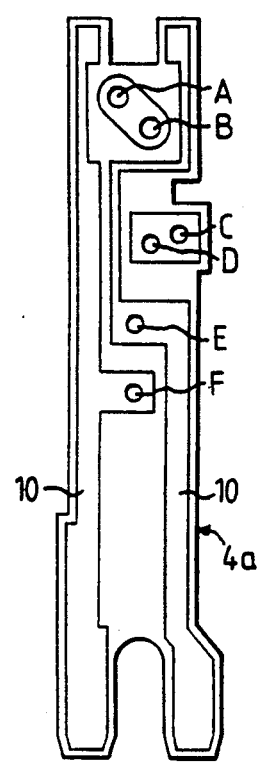
FIG.10
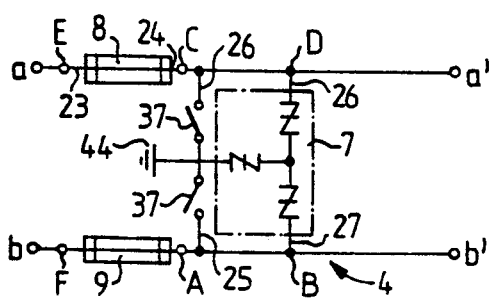
FIG.11
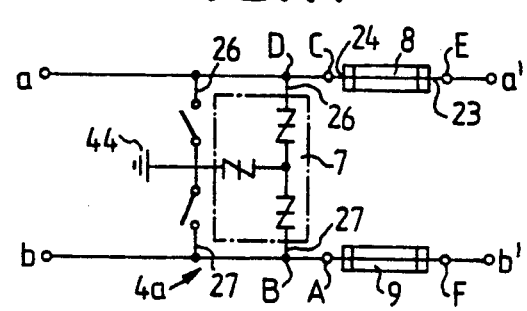

PROTECTIVE PLUG FOR CONNECTOR BANKS OF TELECOMMUNICATION AND DATA SYSTEMS

FIELD AND BACKGROUND OF THE INVENTION

The invention relates to a protective plug for connector banks of telecommunication and data systems comprising a housing for receiving protective elements connected to establish an electrical connection to an earth rail and with a disconnector contact to a bifurcated contact or to circuit tracks provided on a plug tongue for operative contact with terminal contacts connected to incoming and outgoing cable conductors.

A protective plug for connector banks of telecommunication and data systems is known in the art from the publication DE 37 26 741 C1. This publication discloses a connector bank with insulation displacement contacts provided one behind the other in close fit. The insulation displacement contacts are employed for the connection of insulated cable conductors. For protection against overvoltages, one protective plug for each double conductor is insertable between the two lines of insulation displacement connecting contacts. For this purpose, the protective plug comprises a plug tongue projecting from the housing. The plug tongue is inserted into a terminal connected with one insulation displacement contact of each of the two connected telecommunication and data lines. Thus, an electrical connection is established between the insulation displacement contacts and a voltage surge arrester, disposed in the housing of the protective plug. The earth or ground connection, from the voltage surge arrester to an earth rail extending outside the connector bank, is effected over a bifurcated contact. Because of the tight space condition, with such an arrangement of protective plugs arranged in close fit, only protection against overvoltages is possible.

SUMMARY AND OBJECTS OF THE INVENTION

It is an object of the invention to provide a telecommunications and data systems connector bank in which in addition to the protection against overvoltages, a current protection is provided, without increasing the dimensions, in particular without increasing the height of the protective plug.

The invention provides a plug tongue which is provided in the form of a printed-circuit board extending into the plug housing so as to divide the plug housing into two housing compartments. Protective elements are provided inside the housing compartment on either side of the printed-circuit board. The protective element such as over voltage protecting elements and over current protecting elements are connected to one another via circuit tracks formed on the printed-circuit board to provide plated terminal positions.

According to the invention a printed-circuit board is arranged in the housing. On either side of the printed-circuit board, there may be inserted protective elements having different protecting functions. The arrangement requires a minimum amount of space and particularly does not increase the height dimension of the protective plug. Even with the protective plug arranged in close fit and the tight space conditions, a protection against overvoltages and a fuse to protect against overcurrents can be received inside a housing.

The printed circuit boards may be provided depending upon the protection desired. For example, a first circuit board may be provided with a first current fuse connected to third and fifth terminal positions and a second current fuse connected to first and sixth terminal positions wherein a voltage limiting device is connected to the second and fourth terminal positions. A second printed-circuit board may be provided in which a first current fuse is connected to the third and fifth terminal positions and a second current fuse is connected to the first and sixth terminal positions wherein the voltage limiting device is connected to the second and fourth terminal positions. This arrangement allows various possible protecting functions without modifying the constructional arrangement of the protective elements. According to the first circuit board arrangement the current protection is on the line side (incoming side), and according to the second circuit board arrangement the current protection is on the office side (user side or outgoing side).

According to another feature of the invention, the housing is provided with a narrow side with recesses provided at one end and step-type cutouts provided at the other narrow side end. The cable conductors connected to the insulation displacement contacts are accessible when pulling a protective plug out from a line of protective plugs arranged side-by-side in a close fit. Further, cable conductors can be attached by means of a tool to the insulation displacement contacts, without the protective plugs, still inserted, impeding the tool during attachment.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is a cross sectional view through a connector bank and a plugged-on protective plug according to the invention;

FIG. 2 is a top view of several connector banks arranged in two lines showing plugged-on protective plugs according to the invention;

FIG. 6 is a front view of a printed-circuit board of the protective plug according to a first embodiment of the invention;

FIG. 7 is a rear view of the printed-circuit board according to FIG. 6;

FIG. 8 is a front view of a printed-circuit board of the protective plug of a second embodiment of the invention;

FIG. 9 is a rear view of the printed-circuit board according to FIG. 8;

FIG. 10 is a circuit diagram of the printed-circuit board according to FIGS. 6 and 7;

FIG. 11 the circuit diagram of the printed-circuit board according to FIGS. 8 and 9;

DETAILED DESCRIPTION OF THE PREFERRED EMBODIMENT

Figure 3:
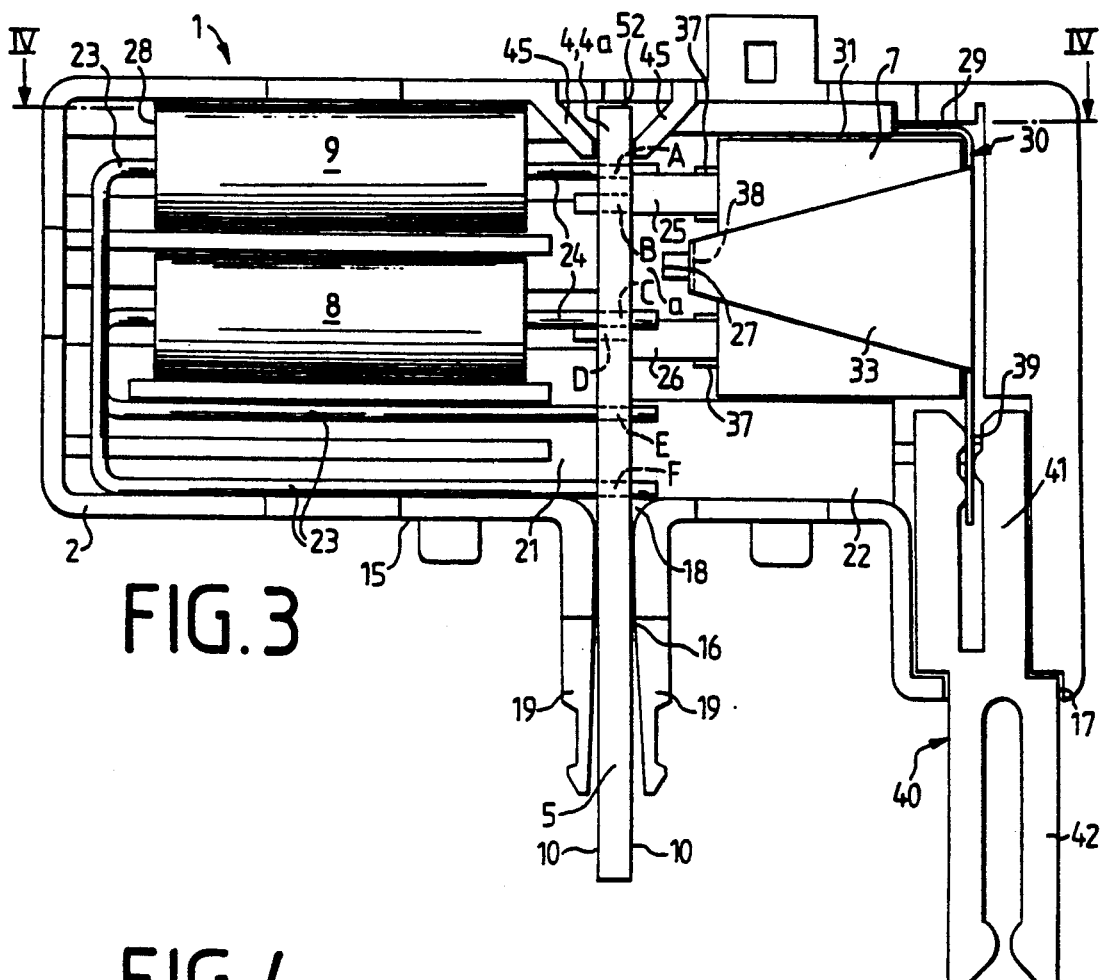
FIG. 3 is an enlarged cross-sectional view through the protective plug.
Figure 4:
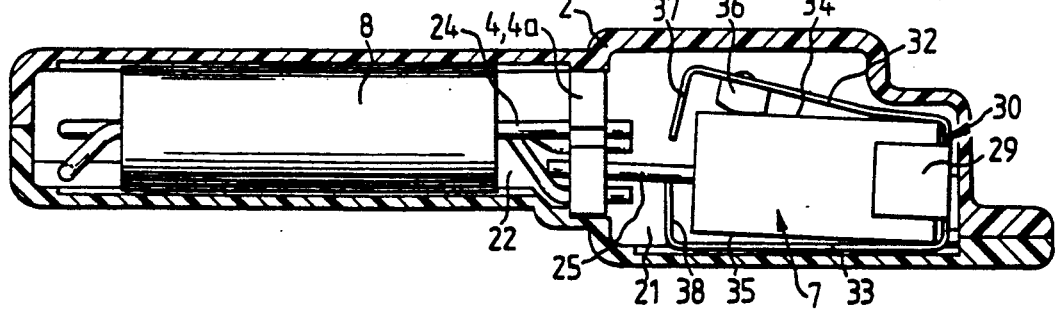
FIG. 4 is a longitudinal sectional view through the protective plug according to line IV—IV of FIG. 3.
Figure 5:
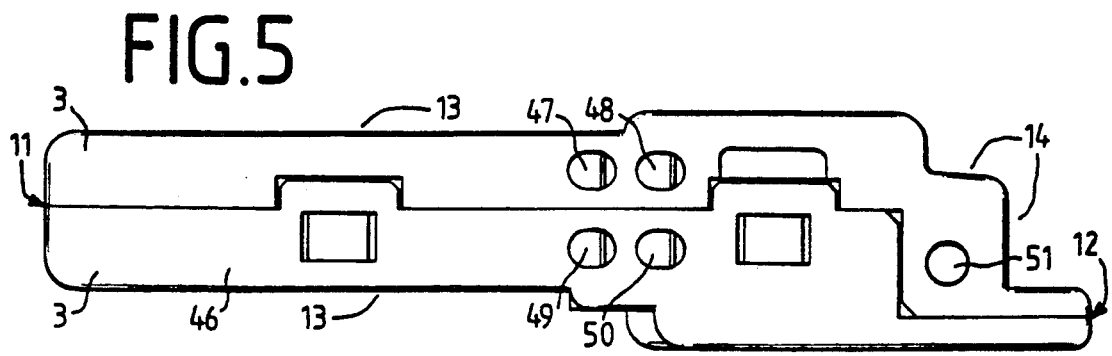
FIG. 5 is top view of the protective plug.

Referring to the drawings in particular, a protective plug 1 is provided comprising a housing 2 formed of two housing halves 3 latched to one another. A printed-circuit board 4 is disposed in the housing 2 and forms a plug tongue 5. A voltage limiting device 7, two current fuses 8, 9 and an earth contact 40 are also provided disposed in the housing 2. The housing 2 is a substantially square-shaped housing body formed of plastic with two housing openings 16, 17 at its bottom side 15.

Figure 12:
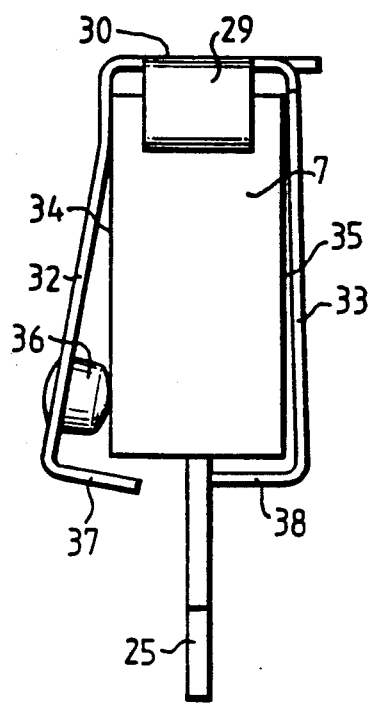
FIG. 12 is a side view of a voltage-limiting device according to the invention.
Figure 13:
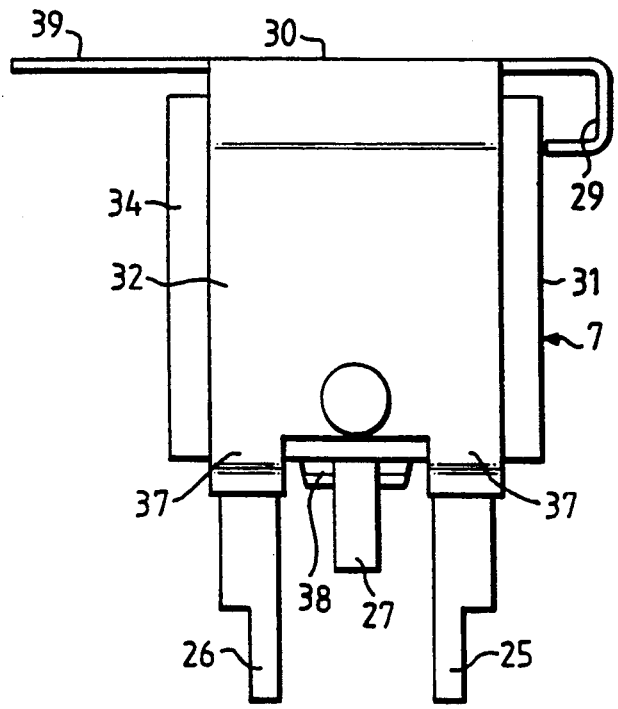
FIG. 13 is a front view of the voltage limiting device.
Figure 14:
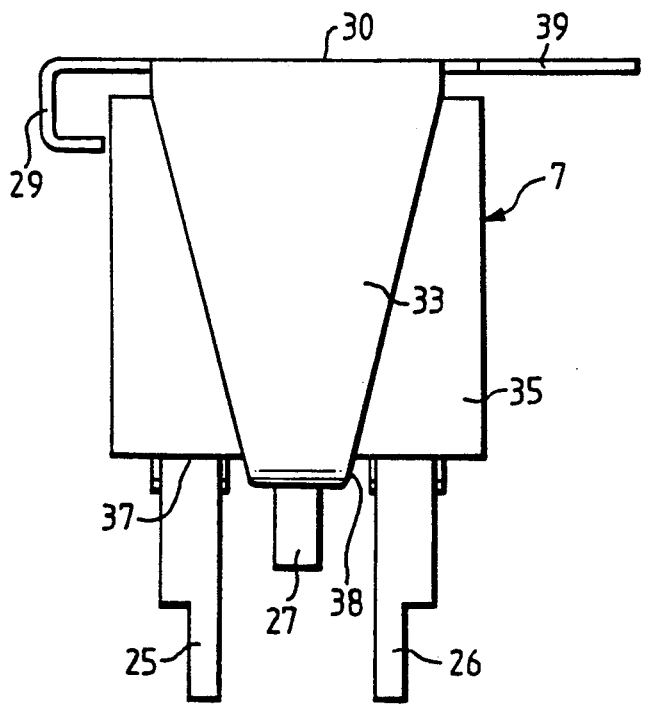
FIG. 14 is a rear view of the voltage limiting device according to FIG. 12.

The slot-type housing opening 16 serves for passing through the printed-circuit board 4 fixed inside the housing 2. The free end of the printed-circuit board 4 extends outwardly and, in free-standing manner, from the housing 2 to form the plug tongue 5. The slot-type housing opening 16 is provided approximately in the central section of the bottom side 15 of the housing 2. The opening 16 is defined at the slotted edge 18 by two latching hooks 19 which are provided for a latch connection of the protective plug 1 to a connector bank 20. The printed-circuit board 4 is guided and supported between the latching hooks 19 abutting on either side. At the other end 52 of the printed-circuit board 4, support hooks 45 are provided in the housing 2. The support hooks 45 support and fix the printed-circuit board 4 on either side. The printed-circuit board 4 is, thus, disposed substantially in the center of the housing 2 and divides the interior space of the housing 2 into two housing compartments 21 and 22. In the first housing compartment 21, two current fuses 8, 9 are arranged. The overcurrent fuses 8, 9 are inserted over their terminal legs 23, 24 into terminal positions A, F and C, E. In the second housing compartment 22, there is provided a voltage limiting device 7, which is inserted over its terminal legs 25, 26 into the terminal positions B, D of the printed-circuit board 4. As the current fuses 8, 9 have their two terminal legs 23, 24 on two opposed side faces 28, the terminal legs 23 of the current fuses 8, 9 are longer and are bent off twice by 90°, such that the ends of all terminal legs 23, 24 of the current fuses 8, 9 extend in the same direction. The voltage limiting device 7 is received in the second housing half 22 (FIGS. 12, 13 and 14) e.g. a so-called solid state protector, comprises a plate-type housing body and has on one housing side three terminal legs 25, 26, 27 arranged in a line. The central terminal leg 27 is shortened such that a spacing a, of the end of the terminal leg 27 from the printed-circuit board 4, will result (see FIG. 3 in particular). Over the voltage limiting device 7, a metal clamp 30 is attached as a thermal protector. The clamp 30 has a substantially U-shaped cross section and comprises several lateral sheet-metal lugs 29 bent off by 90 and resting the side faces 31 of the voltage limiting device 7. The legs 32, 33 of the U-shaped clamp 30 abut the front and rear sides 34, 35 of the voltage limiting device 7. The ends of the legs 32, 33 are bent off by approximately 90°, and form resilient contact elements 37, 38 serving to provide a connection to the terminal legs 25, 26, 27. The leg 33 is of trapezoidal shape and rests against the rear side 35, such that the resilient contact element 38 contacts the central terminal leg 27, without contacting the terminal legs 25, 26. The leg 32 of the clamp 30 is, however, held spaced from the front side 34 by a melt element 36 fastened thereto, such that the contact elements 37, are also spaced from the terminal legs 25, 26. A contact tongue is provided at the clamp 30 inserted into a bifurcated contact 41 of the earth contact 40. The earth contact 40 is built up of a sheet-metal strip. At the ends of the contact 40 one bifurcated contact 41, 42 is formed. The bifurcated contact 41 is arranged inside the housing 2, and the bifurcated contact 42 is arranged outside, the earth contact 40, received and held in the slot-type housing opening 17.

For different protecting functions, either a first printed-circuit board 4 or a second printed-circuit board 4a is provided in the housing 2. Both printed-circuit boards 4, 4a comprise identical terminal positions A to F. These boards differ in their layouts. The printed-circuit board 4 is shown in FIGS. 6 and 7, the respective circuit diagram in FIG. 10. The printed-circuit board 4a is shown in FIGS. 8 and 9, the respective circuit diagram in FIG. 11.

In order to employ the current protection ahead of the overvoltage protection (protection of the line side), the printed-circuit board 4 according to FIGS. 6, 7, 10 is to be used. The circuit diagram according to FIG. 10 shows on the left-hand side the line-side terminals a and b of the cable conductors, and on the right-hand side the office-side (user side) terminals a' and b'. Further, the circuit diagram shows the current fuse 9 connected to the terminal positions A and F and the current fuse 8 connected to terminal positions C and E. The voltage limiting device 7 is connected to the terminal positions D and B. In this circuit diagram, the conductor is connected to terminal position E, the b conductor to terminal position F, the a' conductor to terminal position D, and the b' conductor to terminal position B.

In the case that current protection is required at the rear of the overvoltage protection (protection of the office side or user side), the printed-circuit board 4a according to FIGS. 8, 9 and 11 is to be employed. As the circuit diagram of FIG. 11 shows, on the left-hand side there are arranged the line-side terminals a and b, and on the right-hand side the office-side (user-side) terminals a', b' for the cable conductors. The current fuse 8 is connected to terminal positions C and E, and the current fuse 9 to terminal positions A and F. The voltage limiting device 7 is also connected to terminal positions B and D. In contrast to the first-mentioned printed-circuit board 4, on the printed-circuit board 4a the cable conductor a is connected to terminal position D, the cable conductor b is connected to terminal position B, the cable conductor a' is connected to terminal position E, and the cable conductor b' is connected to terminal position F.

The various circuitries of the protective elements 6 result from the various layouts of the circuit tracks 10 according to FIGS. 6, 7, 8 and 9.

For the suppression of overvoltages and for the protection against overcurrents, the protective plug 1 is inserted between the cable conductors a, b and a', b' into the disconnector contact 43 of a connector bank 20. Instead of disconnector contacts 43, operating contacts (not shown) can also be inserted into the connector bank 20. The connector bank 20 comprises two lines of insulation displacement contacts 42, two opposed insulation displacement contacts 53 being connected over the disconnector contact 43 and being separated by inserting the protective plug 1. Outside the connector bank 20 (as shown in FIG. 1), there is arranged an earth rail 44 extending longitudinally adjacent to the connector bank 20. The protective plug 1 is inserted centrally from above into the connector bank 20, the plug tongue 5 of the protective plug 1 being inserted into the disconnector contact 43. The circuit tracks 10 arranged on either side on the plug tongue 5 are, thus, electrically connected to the disconnector contact 43. The plug tongue 5 further comprises two adjacent circuit tracks 10, on either side, such that a double conductor a, b is protected by a protective plug 1. After inserting the protective plug 1 into the connector bank 20, the bifurcated contact 42, of the earth contact 40 of the protective plug 1, is connected to the earth rail 44, as the earth rail 44 is inserted into the bifurcated contact 42.

In the following, the overvoltage case is explained in more detail, based on the figures. In case of an overvoltage, the current will flow from the cable conductor a over the insulation displacement contact 53 to the disconnector contact 43, and over the circuit tracks 10 of the plug tongue 5 to terminal position E, if the printed-circuit board 4 according to FIG. 10 is employed. From terminal position E, the current will flow through the terminal leg 23, through the current fuse 8, the terminal leg 24 to terminal position C.

From terminal position C over the circuit track 10 to terminal position D, to which is connected the terminal leg 26 of the voltage limiting device 7. The current will then flow through the voltage limiting device 7 to the terminal leg 27, and from there, over the clamp 33 and the contact tongue 39 to the earth contact 40, the bifurcated contact 42 of which is electrically connected to the earth rail 44. The current is led away over the earth rail 44 to earth.

During this process of continuous flow of current through the voltage limiting device 7, heat is developed leading to the melting of the melt element 36. After the melt element 36 becomes molten, the resilient contact elements 37 of the clamp 30 will contact the terminal legs 25 and. 26 of the voltage limiting device 7, and will, thus, short-circuit the voltage limiting device 7, as is represented in the circuit diagram according to FIG. 10. The overvoltage is, thus, led away over terminal position C directly to ground. The melt element 36 serves, therefore, as a thermal protector. For the cable conductor b, the current flow will proceed in similar way over the insulation displacement contact 53 to the disconnector contact 43, over the circuit track 10 of the plug tongue 5 to terminal position F, through the current fuse 9 to terminal position A, over the circuit track 10 to terminal position B being connected to the terminal leg 25 of the voltage limiting device 7. Here, too, the current will flow through the voltage limiting device 7 to terminal leg 27 and from there, over the clamp 30 and the contact tongue 39 to the earth contact 40 and to the earth rail 44.

In case the second printed-circuit board 4a is employed, on which the current protection is arranged on the office side (user side), the flow of current of the current fuses 8, 9 is interrupted for high currents and for low voltages; in this case, the voltage limiting device 7 will not be tripped.

As shown in FIG. 2, the housing 2 of the protective plug 1 on one narrow side 11 is provided on either side with recesses 13, and on the other narrow side 14 with step-type cutouts 14. After pulling a protective plug 1 out from a line of several protective plugs 1 arranged side-by-side in a close fit, the cable conductors a, b connected to the insulation displacement contacts 53 are accessible by the recesses 13. The free space 6 existing after pulling the protective plug 1 out is so large that a non-shown tool may connect the cable conductors a, b without being impeded. By the step-type cutouts 14, a space-saving arrangement is achieved with the two protective plugs 1 inserted into the connector bank 20 in opposed order.

On the top side 46 of the housing 2, in total five housing openings 47 to 51 are provided serving for inserting a test tip of a test plug (not shown).

The housing opening 47 serves for access of the conductor, the housing opening 48 of the a' conductor, the housing opening 49 of the b conductor, the housing opening 50 for the b' conductor, and the housing opening 51 serves as access to earth or ground potential.

While specific embodiments of the invention have been shown and described in detail to illustrate the application of the principals of the invention, it will be understood that the invention may be embodied otherwise without departing from such principals.

What is claimed is:

1. A protective plug for connector banks for telecommunication and data systems, the connector banks having a central earth rail and sets of terminal contacts for incoming and outgoing cable conductors on each side of said central earth rail, each of said sets of terminal contacts including a row of incoming insulation displacement contacts a row of outgoing insulation displacement contacts and disconnector contacts formed between each adjacent incoming displacement contact and each outgoing displacement contact, the plug comprising: an elongate housing with a longitudinal axis, said axis being disposed in a plugged in position extending perpendicular to said central earth rail, and said row of outgoing insulation displacement contacts and said row of incoming insulation displacement contacts; plug tongue means for engagement with said disconnector contact, said plug tongue means being formed as a printed-circuit board extending into said plug housing to define two housing compartments within said plug housing including one housing compartment adjacent said earth rail and another housing compartment on a side of said elongate housing opposite said earth rail; electrical protective elements including protective element disposed in said another housing compartment on a side of said elongate housing opposite of said earth rail, on one side of said printed circuit board and another protective element in said compartment adjacent said earth rail, on another side of said printed circuit; bifurcated contact means supported by said elongate housing extending downwardly for electrical contact with said central earth rail, said bifurcated contact means including a first contact portion extending into said another compartment engaging said another protective element and a second contact portion extending out of said elongate housing and contacting said earth rail; and, circuit tracks and plated terminal positions selectively provided on said printed circuit board for connecting said electrical protective elements in a selected manner to said earth rail and terminal contacts.

2. A protective plug and connector bank arrangement for telecommunication and data systems, comprising:
a connector bank structure including a central earth rail with sets of terminal contacts on each side of said central earth rail, each side of said sets of contacts including a row of incoming insulation displacement contacts, a row of outgoing insulation displacement contacts and disconnector contacts formed between adjacent incoming displacement contacts and outgoing displacement contacts, each of said disconnector contacts being formed for receiving a plug tongue;

an elongated plug housing having a longitudinal axis disposed in a plug in position extending perpendicular to said central earth rail;

a plug tongue detachably fixed to said elongate housing and positioned between opposed contact elements of said disconnector contacts in said plug in position, said plug tongue extending into said plug housing to define two housing compartments within said plug housing including one housing compartment adjacent said earth rail, in said plugged in position, and another housing compartment on a side of said elongated housing opposite said earth rail, in said plugged in position;

earth rail connection means extending from said one housing compartment to said earth rail, at a location spaced from said plug tongue, for engaging said earth rail;

electrical protective elements including one protective element disposed in said one housing and in contact with one side of a printed circuit board and also in contact with said earth rail connection means and another protective element in said another compartment in contact with said another side of said printed circuit board, said plug tongue is disengagably connected to said circuit board, said circuit board comprising one of a first circuit board with circuit tracks arranged for connecting said another electrical protective element on an incoming cable side of the sets of terminal contacts and a second circuit board having circuit tracks arranged for connecting said another electrical protective element on an outgoing side of the sets of terminal contacts; and circuit tracks formed on said plug tongue for connecting said electrical protective elements in a selective manner to said earth rail and terminal contacts, said elongate housing being shaped to engage said earth rail without interfering with a similar protective plug engaging contacts on an opposite side of said earth rail.

3. A protective plug in accordance with claim 2, wherein: said voltage limiting device has a central element with three terminal legs and a resilient V-shaped metal clamp element provided about said central element, said V-shaped metal clamp element including a first side with legs connected to two of said terminal legs and a second side with a leg spaced from a central terminal leg by a internal melt element positioned between said second side and said central element.

4. A protective plug for connector banks for telecommunication and data systems, the connector banks having a central earth rail and sets of terminal contacts for incoming and outgoing cable conductors on each side of said central earth rail, each of said sets of terminal contacts including a row of incoming insulation displacement contacts, a row of outgoing insulation displacement contacts and disconnector contacts formed between each adjacent incoming displacement contact and each outgoing displacement contact, the plug, comprising: an elongate housing with a longitudinal axis, said longitudinal axis being disposed in a plugged in position extending perpendicular to said central earth rail, said row of outgoing insulation displacement contacts and said row of incoming insulation displacement contacts; plug tongue means for engagement with the disconnector contacts, said plug tongue means being formed as a printed-circuit board extending into said plug housing to define two housing compartments within said plug housing including one housing compartment adjacent said earth rail and another housing compartment on a side of said elongate housing opposite said earth rail; electrical protective elements including a protective element disposed in said another housing compartment on a side of elongate housing opposite of said earth rail on one side of said printed circuit board and another protective element in said housing compartment adjacent said earth rail on another side of said printed circuit; bifurcated contact means supported by said elongate housing extending downwardly for electrical contact with said central earth rail, said bifurcated contact means including a first contact portion extending into said another compartment engaging said another protective element and a second contact portion extending out of said elongate housing and contacting said earth rail, one of said protective elements being a voltage-limiting device comprising three terminal legs, a thermal protector being provided for said voltage-limiting device, the ends of said terminal legs being bent off by approximately 90° to form resilient contact elements, a central contact element formed by said legs being electrically connected to a terminal leg, two contact elements of said leg being held spaced from the terminal leg by means of a melt element; and, circuit tracks and plated terminal positions selectively provided on said printed circuit board for connecting said electrical protective elements in a selected manner to said earth rail and terminal contacts.

5. A protective plug according to claim 4, wherein one of said protective elements is a current fuse positioned in a first of said two housing compartments a second of said protective elements is a voltage-limiting device positioned in a second of said two housing compartments.

6. A protective plug according to claim 4, wherein each of said protective elements is connected to one of said terminal positions.

7. A protective plug according to claim 4, wherein a first terminal position is provided connected to a second terminal position and a third terminal position is provided connected to a fourth terminal position over said circuit tracks.

8. A protective plug according to claim 7, wherein said printed circuit board includes one of a first printed circuit layer and a second printed circuit layer, said first circuit layer having circuit layout means for providing current protection on an outgoing cable side of the sets of terminal contacts wherein a first current fuse, in said one compartment, is connected to a third terminal position and a fifth terminal position and a second current fuse, in said one compartment, is connected to a first terminal position and a sixth terminal position, and a voltage-limiting device is provided connected to second and fourth terminal positions, said second printed-circuit layer having circuit layout means for providing current protection on an incoming cable side of the sets of the terminal contacts wherein a first current fuse, in said one compartment, is connected to said third terminal position and said fifth terminal position and a second current fuse is connected to said first terminal position and sixth terminal position and said voltage-limiting device is connected to the second and fourth terminal positions.

9. A protective plug according to claim 4, wherein said housing is provided as a narrow structure with one narrow side having recesses and another narrow side having a step-type cutout.

10. A protective plug according to claim 4, wherein said thermal protector device is a V-shaped metal clamp having two legs.

11. A voltage-limiting device according to claim 4, wherein the ends of said legs are bent off by approximately 90° to form resilient contact elements, a central contact element formed by said legs being electrically connected to a terminal leg, two contact elements formed by said legs being held spaced from opposite terminal leg by means of a melt element.

* * * * *